United States Patent
Winer

(10) Patent No.: US 11,959,977 B2
(45) Date of Patent: Apr. 16, 2024

(54) SYSTEMS AND METHODS FOR FAULT DETECTION IN VARIABLE DIFFERENTIAL TRANSFORMERS

(71) Applicant: Hamilton Sundstrand Corporation, Charlotte, NC (US)

(72) Inventor: Gordon Elliott Winer, Prescott, AZ (US)

(73) Assignee: Hamilton Sundstrand Corporation, Charlotte, NC (US)

(*) Notice: Subject to any disclaimer, the term of this patent is extended or adjusted under 35 U.S.C. 154(b) by 0 days.

(21) Appl. No.: 17/848,916

(22) Filed: Jun. 24, 2022

(65) Prior Publication Data
US 2023/0417845 A1 Dec. 28, 2023

(51) Int. Cl.
*G01R 19/10* (2006.01)
*G01R 19/165* (2006.01)
*G01R 31/62* (2020.01)
*H01F 29/10* (2006.01)

(52) U.S. Cl.
CPC ............. *G01R 31/62* (2020.01); *G01R 19/10* (2013.01); *G01R 19/16576* (2013.01); *H01F 29/10* (2013.01)

(58) Field of Classification Search
CPC .. G05B 19/0428; G05B 19/042; G05B 15/02; G05B 2219/24015; G06F 3/0484; G06F 1/022; G01D 18/008; G01D 3/022; G01D 3/0365; H01F 2/24; H01F 21/06; H01F 29/10; G01R 33/028; G01R 31/62; G01R 19/10; G01R 19/16576
See application file for complete search history.

(56) References Cited

U.S. PATENT DOCUMENTS

| | | | |
|---|---|---|---|
| 4,416,057 A * | 11/1983 | Tardy | G01R 31/62 324/513 |
| 5,210,490 A * | 5/1993 | Munch | B60G 17/01933 324/207.13 |
| 5,767,670 A | 6/1998 | Maher et al. | |
| 7,138,794 B1 | 11/2006 | Cook et al. | |
| 7,317,371 B1 * | 1/2008 | Carroll | G01D 5/2291 336/130 |
| 8,712,710 B2 * | 4/2014 | Nair | G01D 5/24457 702/65 |
| 9,448,275 B2 * | 9/2016 | Wingerter | G01D 3/036 |
| 9,638,735 B2 * | 5/2017 | Reese | G01R 19/10 |
| 9,817,061 B2 * | 11/2017 | Reese | G01R 31/2829 |

(Continued)

FOREIGN PATENT DOCUMENTS

CN 105527530 A 4/2016

OTHER PUBLICATIONS

Extended European Search Report, of the European Patent Office, dated Oct. 20, 2023, in corresponding European Patent Application No. 23181149.8.

*Primary Examiner* — Vinh P Nguyen
(74) *Attorney, Agent, or Firm* — Locke Lord LLP; Joshua L. Jones; Gabriella D'Angelo

(57) ABSTRACT

In accordance with at least one aspect of this disclosure, a system can include a primary coil wound around a moveable magnetic core, at least one secondary coil wound in one continuous direction and magnetically coupled with the primary coil, and a controller operatively connected to determine a position of the moveable magnetic core and configured to detect a fault across the secondary coil.

12 Claims, 11 Drawing Sheets

(56) References Cited

U.S. PATENT DOCUMENTS

| | | | |
|---|---|---|---|
| 9,952,064 B2* | 4/2018 | Deshmukh | G01B 7/003 |
| 10,332,675 B2* | 6/2019 | Esakki | H01F 29/10 |
| 10,345,357 B2* | 7/2019 | Wingerter | G01R 31/62 |
| 10,446,310 B2* | 10/2019 | Sanchihar | G01D 5/2291 |
| 11,209,290 B2 | 12/2021 | Hess et al. | |
| 11,557,430 B2* | 1/2023 | Buell | H01F 27/28 |
| 2012/0326824 A1 | 12/2012 | Harris | |
| 2015/0142353 A1 | 5/2015 | Cabret et al. | |
| 2017/0016946 A1 | 1/2017 | Reese et al. | |
| 2022/0003809 A1 | 1/2022 | Jianjun et al. | |

\* cited by examiner

SYSTEMS AND METHODS FOR FAULT DETECTION IN VARIABLE DIFFERENTIAL TRANSFORMERS

TECHNICAL FIELD

The present disclosure relates to variable differential transformers, and more particularly to fault detection in variable differential transformers.

BACKGROUND

Measurement devices, such as variable differential transformers, can be used as absolute position sensors. In certain applications, for example, in aircraft, linear variable differential transformers and rotary variable differential transformers need to provide precise position measurements. But due to their inclusion in harsh environments, they may experience faults or shorts leading to inaccurate measurements, or failure altogether. In such cases, it is critical to know of a fault so that any measurements from the faulty device can be disregarded. Typical interfaces include some form of short circuit detection, however detecting a short across secondary coils of the devices has been difficult.

There remains a need in the art for improvements to short detection in variable differential transformers, for example in the aerospace industry, which allows for enhanced short detection within the secondary coils. This disclosure provides a solution for this need.

SUMMARY

In accordance with at least one aspect of this disclosure, a system includes a primary coil wound around a moveable magnetic core configured to receive current from a power source. At least one secondary coil is wound around the moveable magnetic core in one continuous direction and magnetically coupled with the primary coil. The secondary coil can be wound around the moveable magnetic core such that the winding direction for the entire secondary coil is in the same direction. A controller is operatively connected to determine a position of the moveable magnetic core and configured to detect a fault across the secondary coil. In embodiments, the at least one secondary coil can be wound in a series-aiding configuration. In certain embodiments, the at least one secondary coil can include a single, continuous secondary coil, and the single, continuous secondary coil can be wound in a series-aiding configuration relative to the secondary coil center-tap.

In embodiments, the system can include the power source and the primary coil can include a high side line and a low side line each operatively connected to the power source. In certain embodiments, the secondary coil can include a first side line, a second side line, and one center-tap. In embodiments, the secondary coil can be wound such that the first side line and the second side line of the secondary coil are 180 degrees out of phase relative to one another.

In embodiments, the controller can be configured to perform a built-in-test (BIT) function to determine if a fault has occurred across the secondary coil. The controller can be configured to (e.g., in performing the BIT function) sample a voltage of the first side line with respect to the center-tap and a voltage of the second side line with respect to the center-tap and determine a sum voltage of the first side line and the second side line. The controller can be configured to compare the sampled sum voltage to a known sum voltage and determine if a fault has occurred across the secondary coil if the difference between the sum voltage of the first side line with respect to the center-tap and the second side line with respect to the center-tap and the known sum voltage is greater than a predetermined threshold. The controller can be configured to determine if a fault has occurred across the secondary coil if the sum voltage of the first side line with respect to the center-tap and the second side line with respect to the center-tap is at or near zero.

In embodiments, the primary coil, the at least one secondary coil, and the moveable magnetic core can form a variable differential transformer. In certain embodiments, the variable differential transformer can include a linear variable differential transformer. In certain embodiments, the variable differential transformer can include a rotary variable differential transformer.

In certain embodiments, the variable differential transformer can include a five-wire variable differential transformer. In certain such embodiments, the at least one secondary coil can be a single center-tapped secondary coil. The single secondary coil can be one continuous winding wound around the moveable magnetic core in one direction.

In certain embodiments, the variable differential transformer can include a six-wire variable differential transformer. In certain such embodiments, the at least one secondary coil can include two secondary coils. A first secondary coil can be wound around the moveable magnetic core in a first winding direction and a second secondary coil can be wound around the moveable magnetic core in a second winding direction. In embodiments, the first winding direction can be the same as the second winding direction such that the first and second secondary windings are in a series-aiding configuration.

In accordance with at least one aspect of this disclosure, a method can include detecting a fault in at least one secondary winding of a variable differential transformer across a first side line with respect to a center-tap and a second side line with respect to the center-tap using a sum voltage of the first side line and the second side line, and outputting a fault detection signal to a user indicting the fault. In embodiments, the secondary winding can be wound in one continuous direction. In certain embodiments, the at least one secondary winding can include one secondary winding wound in one direction. In certain embodiments, the at least one secondary winding can include two secondary windings wound in the same direction relative to one another.

In embodiments, detecting can include sampling a voltage of the first line of the at least one secondary winding with respect to the center-tap, sampling a voltage of the second side line of the at least one secondary winding with respect to a center-tap and summing the voltage of the first side line and the second side line.

In embodiments, detecting can include comparing the sum voltage to a known sum voltage and detecting a fault if the difference between the sum voltage of the first side line and the second side line is the known sum voltage is greater than a predetermined threshold. In embodiments, detecting can include detecting a fault if the sum voltage is at or near 0.

These and other features of the embodiments of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION

Figure 1:
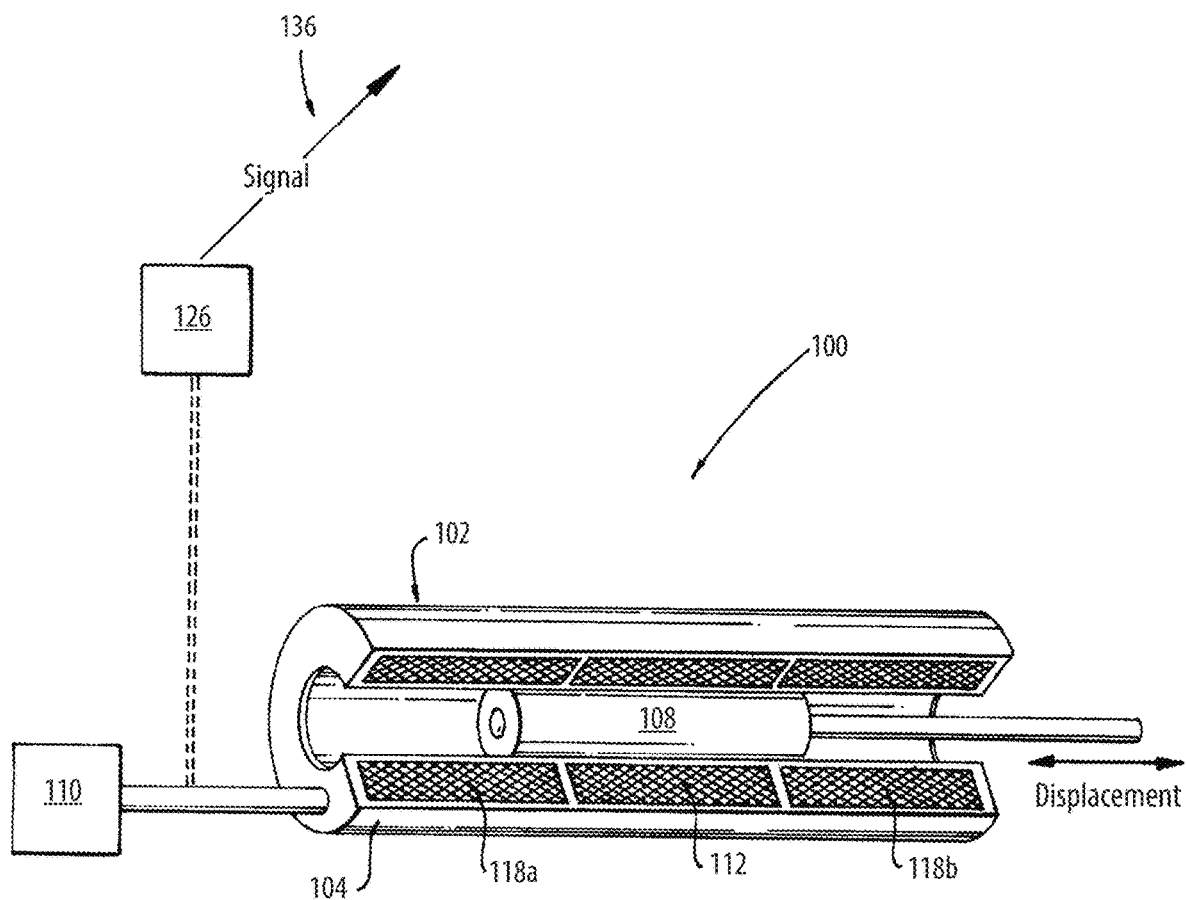
FIG. 1 is a dissected perspective view of an embodiment of a variable differential transformer in accordance with this disclosure, showing a core of the variable differential transformer moving between a retracted position and an extended position.

Reference will now be made to the drawings wherein like reference numerals identify similar structural features or aspects of the subject disclosure. For purposes of explanation and illustration, and not limitation, an illustrative view of an embodiment of a system in accordance with the disclosure is shown in FIG. 1 and is designated generally by reference character 100. Other embodiments and/or aspects of this disclosure are shown in FIGS. 2-11.

In accordance with at least one aspect of this disclosure, a system 100 can include a variable differential transformer 102 defined by a housing 104, including one or more electronic components 106, and a moveable magnetic core 108. The one or more electronic components 106 can include any suitable hardware and/or software configured to receive power from a power supply 110 and determine a position of the moveable magnetic core 108. The variable differential transformer 102 can include a linear variable differential transformer, e.g., as shown, or in certain embodiments, the variable differential transformer can include a rotary variable differential transformer, for example.

Figure 2:
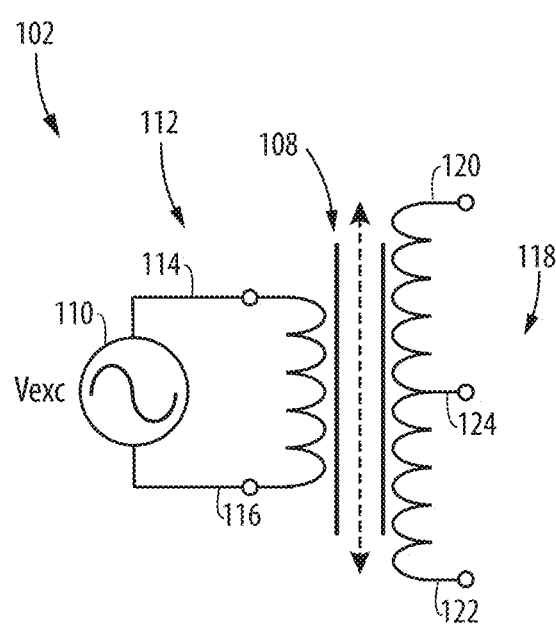
FIG. 2 is a schematic diagram of one or more electronic components within the variable differential transformer of FIG. 1.
Figure 3A:
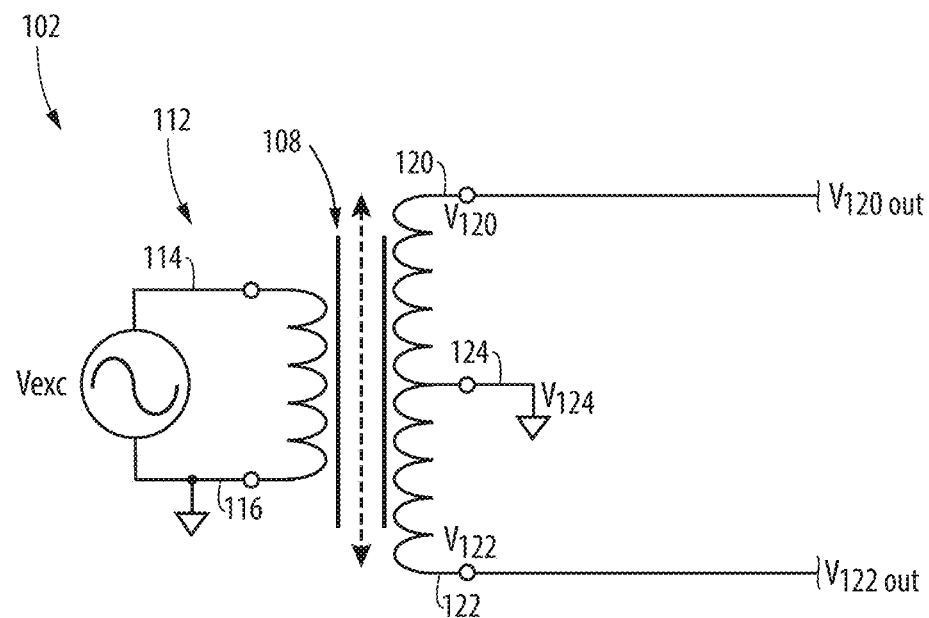
FIG. 3a is a schematic diagram of one or more electronic components within the variable differential transformer of FIG. 1.
Figure 3B:
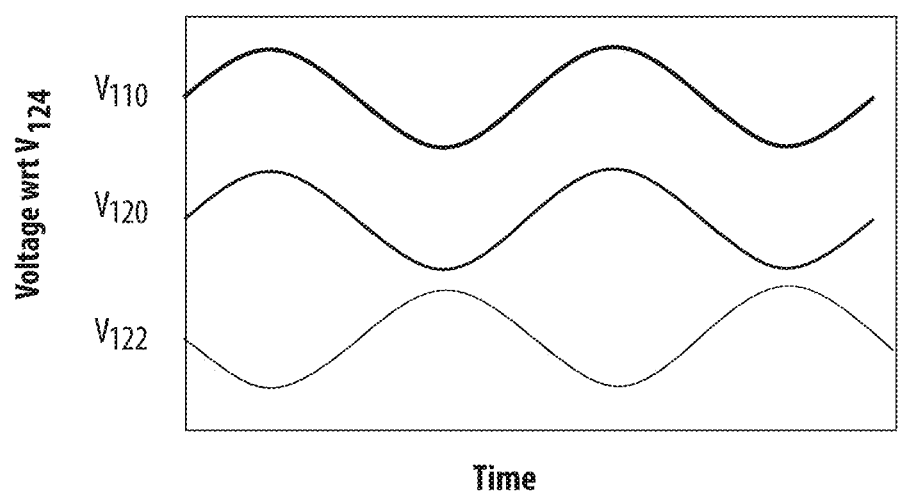
FIG. 3b is a graph showing a voltage phase relationship with respect to ground of the one or more electrical components in an operational state.

As shown in FIGS. 1-3, the one or more electronic components 106 of the variable differential transformer 102 can include a primary coil 112 wound around the moveable magnetic core 108. The primary coil 112 can be configured to receive current from the power source 110 (e.g., via electrical connection between the transformer 102 and the external power supply 110). The primary coil 112 can include a high side line 114 and a low side line 116 each operatively connected to the power source 110. At least one secondary coil 118 can be wound around the moveable magnetic core 108 wound in one continuous direction and magnetically coupled to the primary winding 112. For example, as shown in FIG. 2, a single secondary coil 118 is shown. The secondary coil 118 can include a first side line 120, a second side line 122, and at least one center-tap 124. In certain embodiments, the secondary coil 118 can be wound in a single continuous direction (e.g., along an entire length of the core 108) such that the first side line 120 and the second side line 122 of the secondary coil are 180 degrees out of phase relative to one another.

The one or more electronic components 106 of the variable differential transformer 102 can include a controller 126, or a controller 126 can be operatively connected to the variable differential transformer 102, to determine the position of the moveable magnetic core 108. The controller 126 can also be configured to detect a fault across the secondary coil 118. For example, the controller 126 can be configured to perform a built-in-test (BIT) function to determine if a fault has occurred across the secondary coil 118.

Figure 4A:
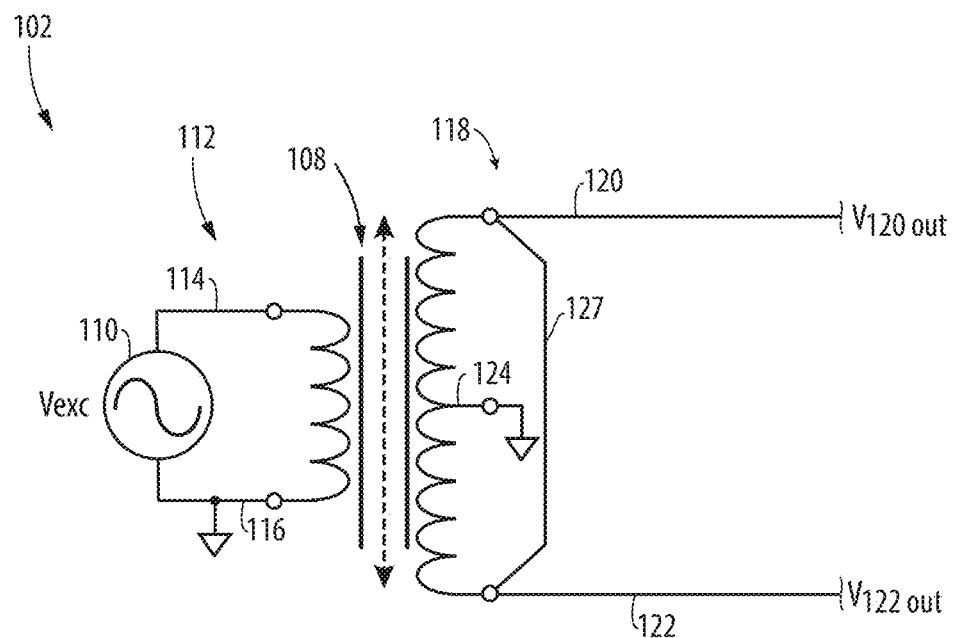
FIG. 4a is a schematic view of one or more electronic components within the variable differential transformer of FIG. 1 showing a fault condition.
Figure 4B:
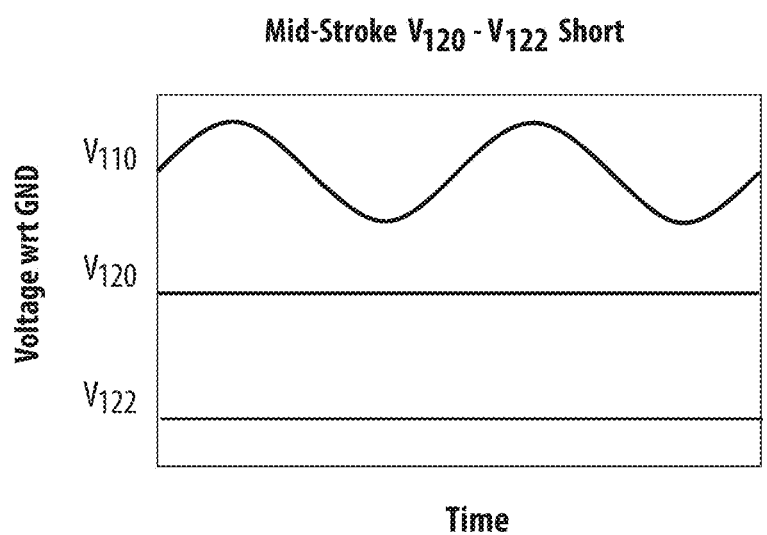
FIG. 4b is a graph showing a phase relationship of the one or more electrical components in a faulted state.

As shown in FIGS. 4a-4b, to conduct the BIT function, the controller 126 can be configured to sample a voltage of the first side line 120 with respect to the center-tap 124 and a voltage of the second side line 122 with respect to the center-tap 124 and determine a sum voltage of the first side line 120 and the second side line 122. The controller 126 can be configured to compare the sampled sum voltage to a known sum voltage and determine if a fault has occurred across the secondary coil 118 if the difference between the sum voltage of the first side line 120 and the second side line 122 and the known sum voltage is greater than a predetermined threshold. In certain embodiments, the controller 126 can be configured to compare the sampled sum voltage to a known predetermined threshold and determine if a fault has occurred across the secondary coil 118 if the sampled sum voltage is less than the predetermined threshold. One having ordinary skill in the art in view of this disclosure would understand what an appropriate predetermined threshold would be in the given context without undue experimentation.

Providing a predetermined threshold allows for some tolerance in the voltage samplings and imperfections in a practical variable differential transformer 102. But if the difference between the sampled sum voltage and the known voltage exceeds the threshold, the controller 126 will determine that a fault has occurred in the transformer 102, the fault including a short circuit 127 from the first side line 120 to the second side line 122. This can be seen schematically in FIG. 4, for example. In certain conditions, a fault 127 across the secondary coil 118 will be detected if the sum voltage of the first side line 120 with respect to the center-tap and the second side line 122 with respect to the center-tap is less than a predetermined threshold, or when the sum voltage is at or near zero.

Figure 5:
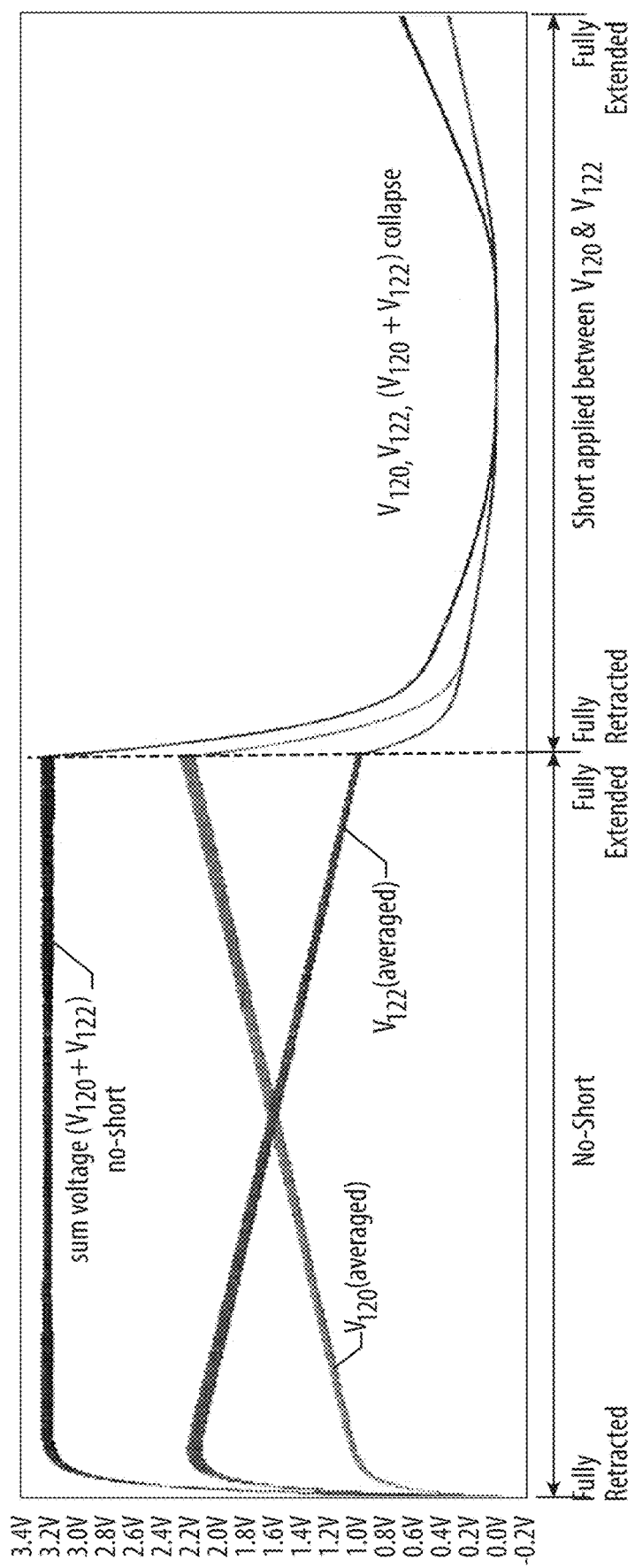
FIG. 5 is a numeric graphical representation of simulated DC equivalent sampled voltages with respect to a center-tap for the one or more electrical components during the operational state and the faulted state.
Figure 6:
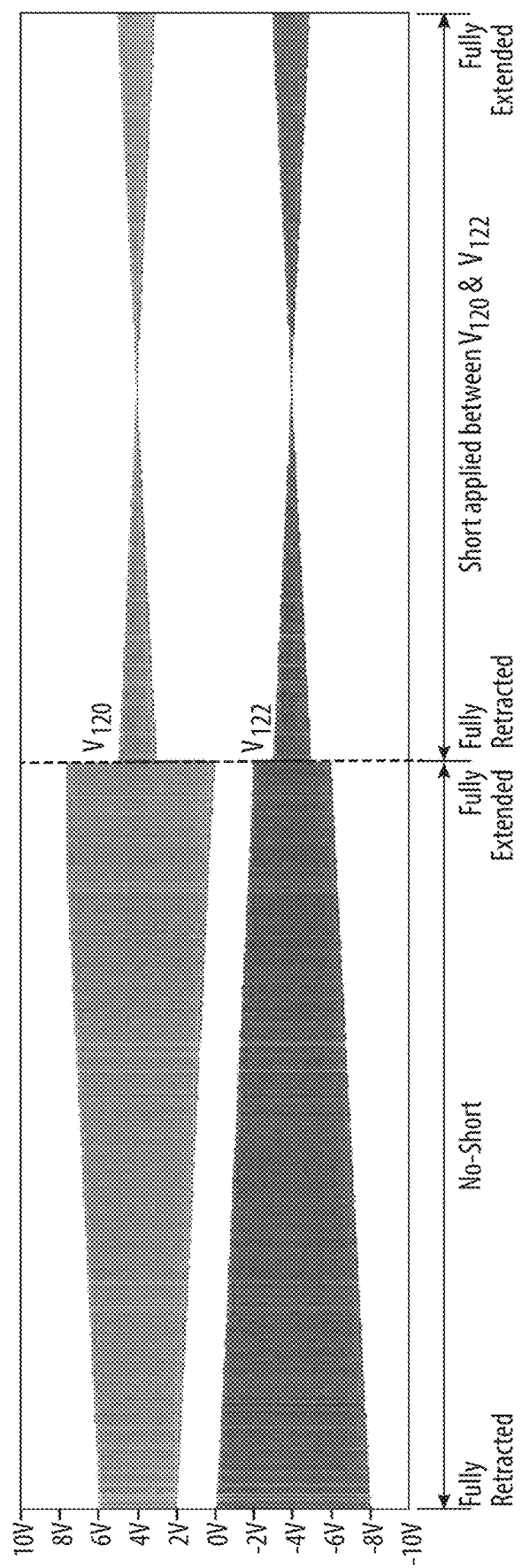
FIG. 6 is a graphical representation of the waveforms for the simulated AC sinusoidal sampled voltages with respect to a center-tap in a compressed time scale for the one or more electrical components at a given position during the operational state and the faulted state.
Figure 7:
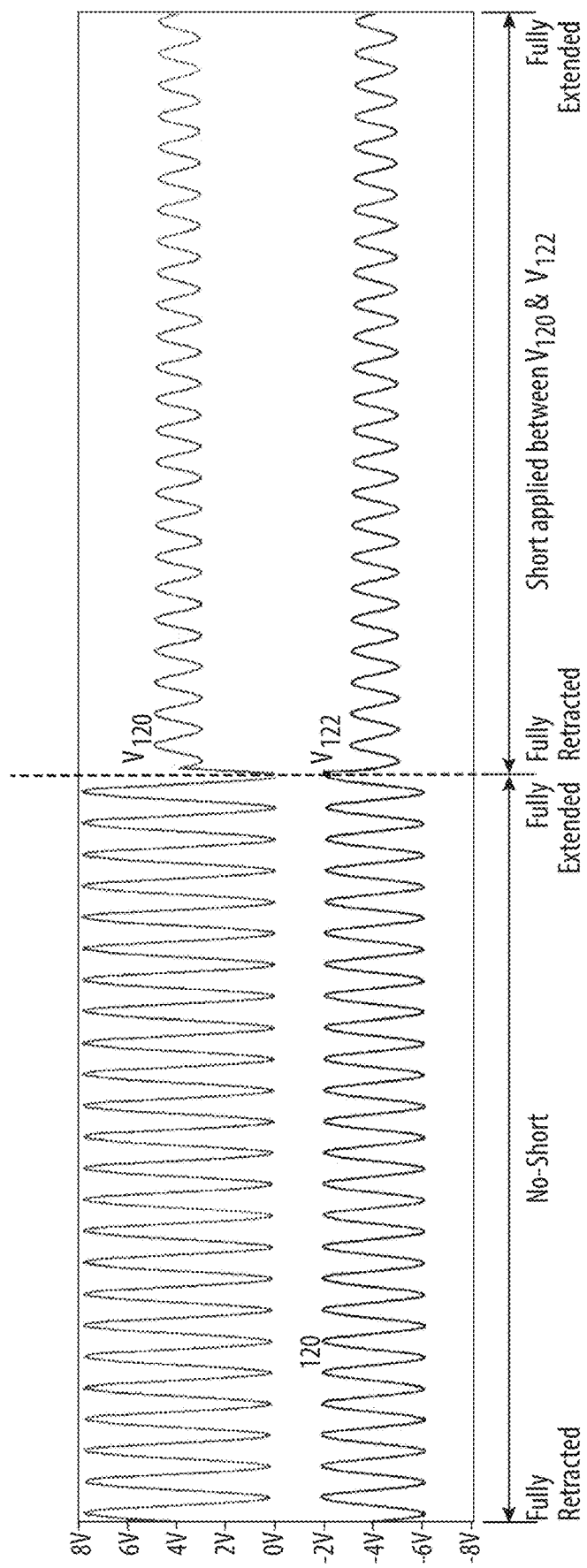
FIG. 7 is a time-expanded graphical representation of the AC sinusoidal waveforms with respect to a center-tap of FIG. 6.

Conventionally (e.g., when the secondary coil on either side of the center-tap is wound in a series-opposing configuration), it may be difficult to observe a difference in sampled sum voltage to known sum voltage because the difference between the sampled and known sums will be slight. But winding the secondary coil 118 on either side of the center-tap in a series-aiding configuration as described herein will collapse the voltages across the secondary coil during a fault so that the voltage at both the first side line and the second side line will be at or near zero, resulting in a sampled sum voltage of near zero or zero, such as shown in FIGS. 5-7. This will make the fault much easier for the controller to detect.

Figure 8:
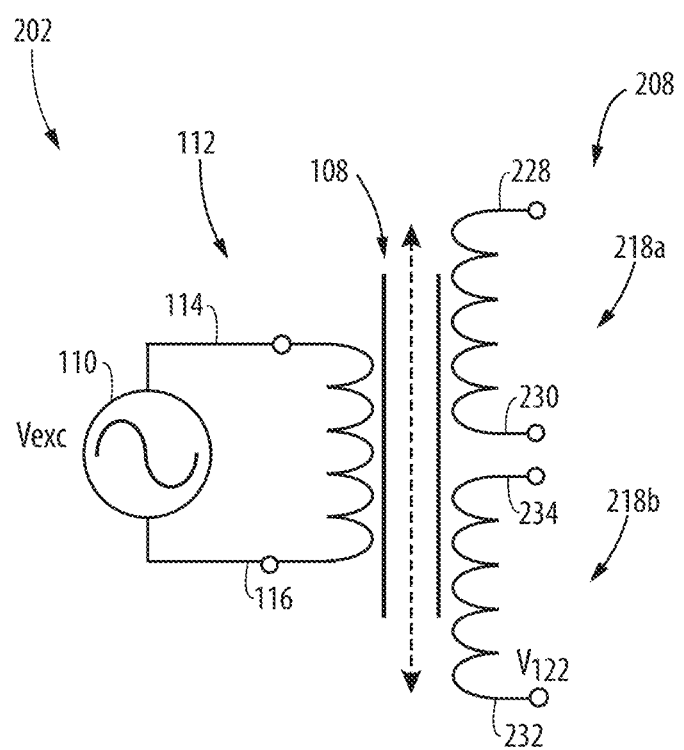
FIG. 8 is a schematic view of one or more electronic components within another embodiment of a variable differential transformer.
Figure 9A:
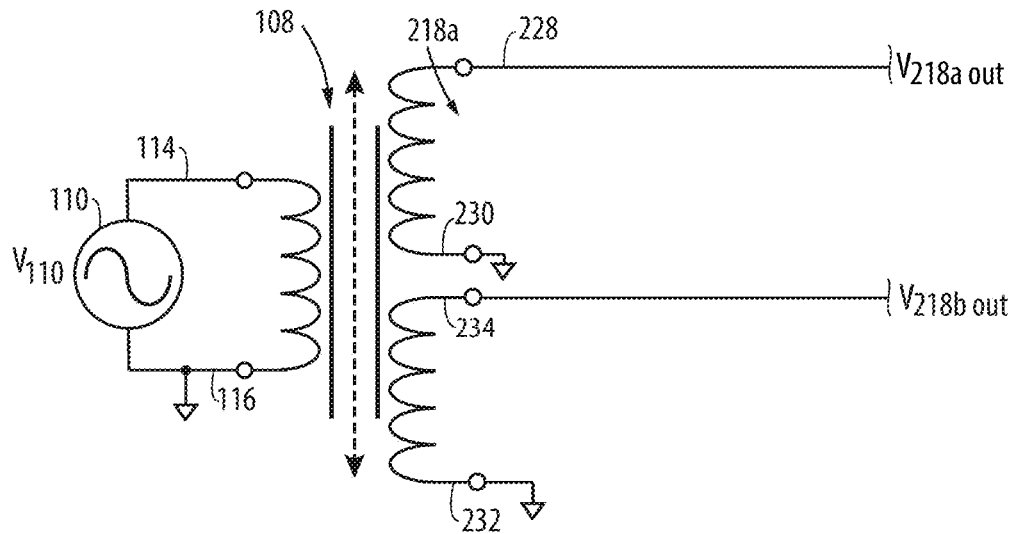
FIG. 9a is a schematic view of one or more electronic components within the variable differential transformer of FIG. 8.
Figure 9B:
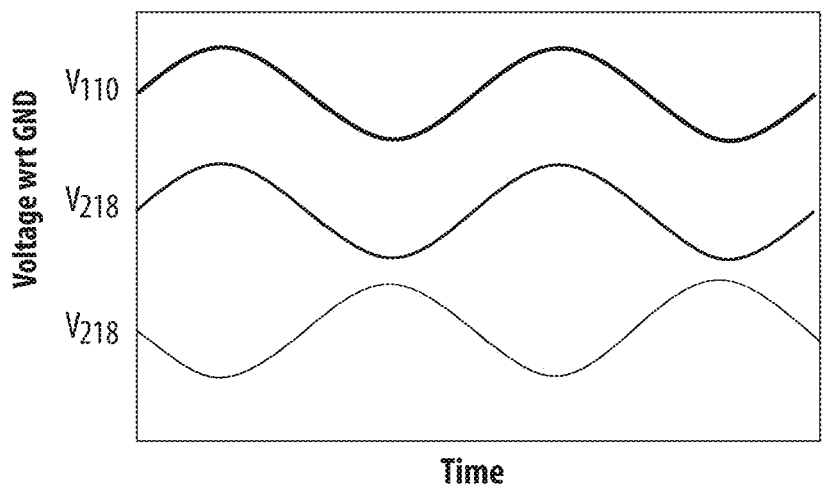
FIG. 9b is a graph showing a voltage phase relationship with respect to ground of the one or more electrical components in an operational state.
Figure 10A:
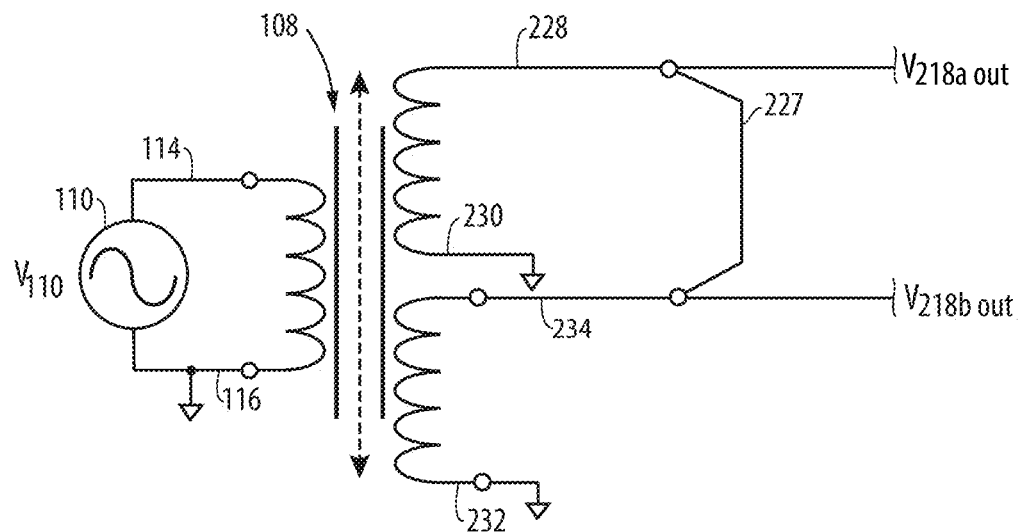
FIG. 10a is a schematic view of one or more electronic components within the variable differential transformer of FIG. 8.
Figure 10B:
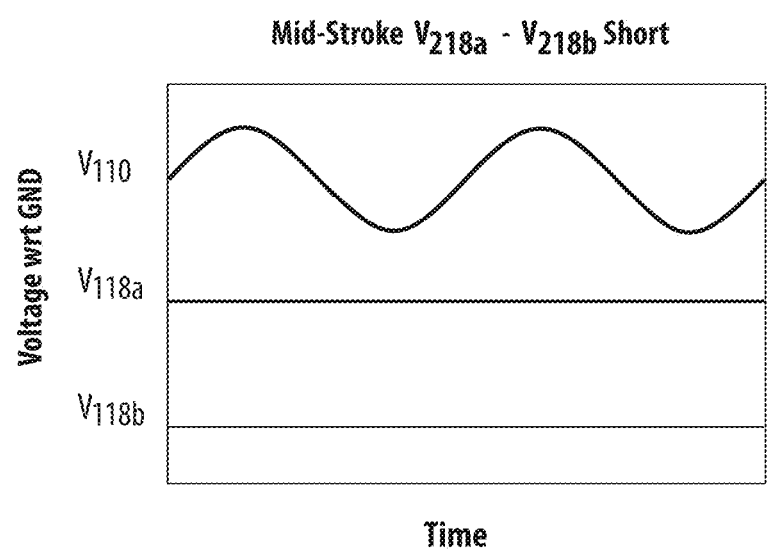
FIG. 10b is a graph showing a phase relationship of the one or more electrical components with respect to a center tap in a faulted state.

In accordance with at least one aspect of this disclosure, another embodiment of a system 200 is shown in FIGS. 8-10. The system 200 can have similar components and features with respect to system 100. For brevity, the description of common elements that have been described above for system 100 are not repeated with respect to the system 200 as shown in FIGS. 8-10. In system 200, the transformer 202 can be a six-wire transformer, where the secondary coil includes a first and second secondary coil 218*a*, 218*b*. Each secondary coil can include a high side line and a low side line. The first secondary coil 218*a* can include high side line 228 and low side line 230, and the second secondary coil 218*b* can include high side line 232 and low side line 234. The first and second secondary coils 218*a*, 218*b* can be wound similar to that of secondary coil 218 of system 100, such that both secondary coils 218*a*, 218*b* are in a series-aiding configuration. The controller 126 can be configured to perform the same BIT function on the system 200 as performed in system 100, in a similar manner, e.g., to detect the fault or short circuit 227 across the secondary coils 218*a*, 218*b*, as shown in FIGS. 10*a*-10*b*.

Figure 11:
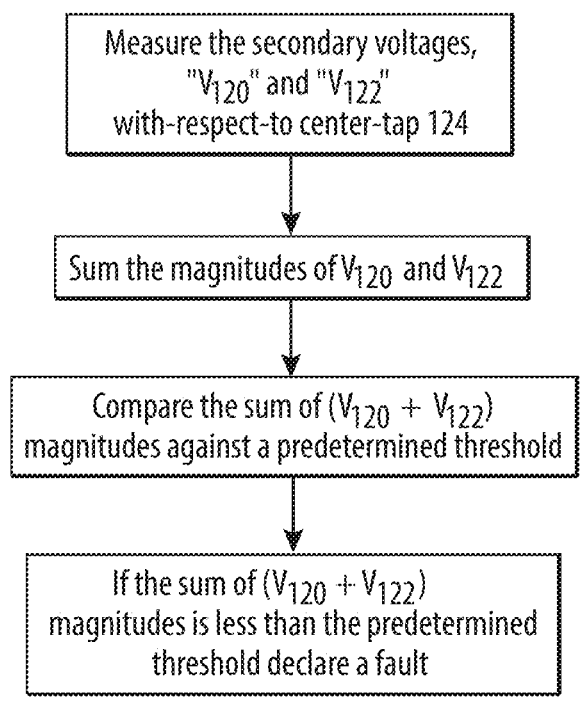
FIG. 11 is a box diagram of a method in accordance with at least one aspect of this disclosure.

In accordance with at least one aspect of this disclosure, as shown in FIG. 11, a method (e.g., a built-in-test method) can include, detecting a fault in a secondary winding (e.g., winding 118, 218*a*, 218*b*) of a variable differential transformer (e.g., transformer 102, 202) across a first side line (e.g., lines 120, 228, 230) and a second side line (e.g., lines 122, 232, 234) using a sum voltage of the first side line with respect to the center-tap and the second side line with respect to the center-tap. The method can include outputting a fault detection signal (e.g., 136) to a user indicting the fault. For example the controller (e.g., controller 126) may output a fault detection signal to a main control panel, or may issue a warning to a user that one or more readings from the transformer may be incorrect and that the transformer or associated wiring between the transformer and controller needs replacing.

In embodiments, detecting can include sampling a voltage of the first line of the secondary winding with respect to a center-tap, sampling a voltage of the second side line of the secondary winding with respect to the center-tap, and summing the voltage of the first side line and the second side line.

In embodiments, detecting can include comparing the sum voltage to a known sum voltage and detecting a fault if the difference between the sum voltage of the first side line and the second side line is the known sum voltage is greater than a predetermined threshold. In embodiments, detecting can include detecting a fault if the sum voltage is at or near 0.

Variable differential transformers can be used in a wide range of applications to determine a position of a given object. For example, in aerospace applications, the variable differential transformer 102 can be used to determine a position of an aircraft control surface, or a position of a valve in a fuel system, among other things. It is important for proper function of aircraft systems that such position measurements are accurate. Therefore, detecting faults within the variable differential transformers (and/or wiring faults can between the variable differential transformer and controller) is critical for ensuring the measurements being relied upon are in fact reflective of the current state of the system. Embodiments provide a more effective means to detect a short circuit between the first and second lines of a 5-wire and 6-wire variable differential transformers (e.g., linear or rotary). The secondary windings of the variable differential transformer can be connected in series-aiding polarities (e.g., instead of the conventional series-opposing polarities). In a 5-wire system, the secondary windings can be wound in the series-aiding polarity across the center tap, and in a 6-wire system, the first and second secondary windings can be connected in the series-aiding polarity, where both secondary coils are wound in the same direction.

Embodiments may employ ratiometric processing, where transformer position is a function of $[(Va-Vb)/(Va+Vb)]$ as well as built in test (BIT) methods using such functions, including a "sum voltage check" $(Va+Vb)$, or checks on the magnitudes of Va or Vb, or checks on the frequency of Va or Vb. In embodiments, the first line of the secondary winding (Va) with respect to a center-tap (VCOM) and the second line of the secondary winding (Vb) with respect to the center-tap can be 180 degrees out-of-phase. In the transformer wound in a series-aiding winding, when a short circuit occurs across the first and second lines, the shorted first and second lines tend to produce zero volts with respect to the center-tap (e.g., ground).

Conventional variable differential transformers where the secondary coils are wound as series-opposing, produce legitimate Va, Vb, (Va+Vb) amplitudes during short between the first and second lines, and thus BIT cannot detect the short at any position of the transformer. But because of the series-aiding windings, embodiments produce small (e.g., out-of-range) amplitudes during short between the first and second lines allowing BIT to detect the short at all positions of the transformer. Therefore embodiments provide improved methods for detecting a fault in a variable differential transformer.

As will be appreciated by those skilled in the art, aspects of the present disclosure may be embodied as a system, method or computer program product. Accordingly, aspects of this disclosure (e.g., electronic components 106 and/or controller 126) may take the form of an entirely hardware embodiment, an entirely software embodiment (including firmware, resident software, micro-code, etc.), or an embodiment combining software and hardware aspects, all possibilities of which can be referred to herein as a "circuit," "module," or "system." A "circuit," "module," or "system" can include one or more portions of one or more separate physical hardware and/or software components that can together perform the disclosed function of the "circuit," "module," or "system", or a "circuit," "module," or "system" can be a single self-contained unit (e.g., of hardware and/or software). Furthermore, aspects of this disclosure may take the form of a computer program product embodied in one or more computer readable medium(s) having computer readable program code embodied thereon.

Computer program instructions may also be stored in a computer readable medium that can direct a computer, other programmable data processing apparatus, or other devices to function in a particular manner. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified herein.

Those having ordinary skill in the art understand that any numerical values disclosed herein can be exact values or can be values within a range. Further, any terms of approximation (e.g., "about", "approximately", "around") used in this disclosure can mean the stated value within a range. For example, in certain embodiments, the range can be within (plus or minus) 20%, or within 10%, or within 5%, or within 2%, or within any other suitable percentage or number as appreciated by those having ordinary skill in the art (e.g., for known tolerance limits or error ranges).

The articles "a", "an", and "the" as used herein and in the appended claims are used herein to refer to one or to more than one (i.e., to at least one) of the grammatical object of the article unless the context clearly indicates otherwise. By way of example, "an element" means one element or more than one element.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of."

Any suitable combination(s) of any disclosed embodiments and/or any suitable portion(s) thereof are contemplated herein as appreciated by those having ordinary skill in the art in view of this disclosure.

The embodiments of the present disclosure, as described above and shown in the drawings, provide for improvement in the art to which they pertain. While the apparatus and methods of the subject disclosure have been shown and described, those skilled in the art will readily appreciate that changes and/or modifications may be made thereto without departing from the scope of the subject disclosure.

What is claimed is:

1. A system, comprising:
    a primary coil wound around a moveable magnetic core;
    at least one secondary coil wound around the moveable magnetic core in one continuous direction and magnetically coupled with the primary coil; and
    a controller operatively connected to determine a position of the moveable magnetic core and configured to detect a fault across the secondary coil,
    wherein the secondary coil includes a first side line, a second side line, and a center-tap, wherein the first side line and the second side line of the at least one secondary coil are 180 degrees out of phase relative to one another, wherein the controller is configured to perform a built-in-test (BIT) to detect the fault across the secondary coil, wherein the controller is configured to sample a voltage of the first side line with respect to the center-tap and a voltage of the second side line with respect to the center-tap and determine a sum voltage of the first side line and the second side line.

2. The system of claim 1, wherein the controller is configured to compare the sampled sum voltage to a known sum voltage and determine if a fault has occurred across the secondary coil if a difference between the sum voltage of the first side line with respect to the center-tap and the second side line with respect to the center-tap and the known sum voltage is greater than a predetermined threshold.

3. The system of claim 2, wherein the controller is configured to determine if a fault has occurred across the secondary coil if the sum voltage of the first side line with respect to the center-tap and the second side line with respect to the center-tap is at or near zero.

4. The system of claim 3, wherein the primary coil, the at least one secondary coil, and the moveable magnetic core form a variable differential transformer.

5. The system of claim 4, wherein the variable differential transformer includes a linear variable differential transformer.

6. The system of claim 4, wherein the variable differential transformer includes a rotary variable differential transformer.

7. The system of claim 1, wherein the variable differential transformer includes a five-wire variable differential transformer such that the at least one secondary coil includes a single center-tapped secondary coil, wherein the single secondary coil is one continuous winding wound around the moveable magnetic core in one direction.

8. The system of claim 1, wherein the variable differential transformer includes a six-wire variable differential transformer such that the at least one secondary coil includes two secondary coils.

9. The system of claim 8, wherein a first secondary coil is wound around the moveable magnetic core in a first winding direction and a second secondary coil is wound around the moveable magnetic core in a second winding direction.

10. The system of claim 9, wherein the first winding direction is the same as the second winding direction.

11. A method, comprising:
    detecting a fault in at least one secondary winding of a variable differential transformer across a first side line with respect to a center-tap and a second side line with respect to the center-tap using a sum voltage of the first side line and the second side line; and outputting a fault detection signal to a user indicting the fault
wherein the at least one secondary winding includes one secondary winding wound in one direction, wherein the at least one secondary winding includes two secondary windings wound in the same direction relative to one another, sampling a voltage of the first line of the at least one secondary winding with respect to the center-tap;
wherein detecting the fault includes:
  sampling a voltage of the second side line of the at least one secondary winding with respect to the center-tap; and
  summing the voltage of the first side line and the second side line, comparing the sum voltage to a known sum voltage; and
  detecting a fault if a difference between the sum voltage of the first side line and the second side line is greater than a predetermined threshold, comparing the sum voltage to a known sum voltage; and
  detecting a fault if a difference between the sum voltage of the first side line and the second side line is at or near zero.

12. A system, comprising:
a primary coil wound around a moveable magnetic core of a variable differential transformer;
at least one secondary coil wound around the moveable magnetic core in one continuous direction and magnetically coupled with the primary coil; and
a controller operatively connected to the variable differential transformer configured to perform the method of claim 11 to determine a position of the moveable magnetic core and configured to detect a fault across the secondary coil.

* * * * *